United States Patent [19]
Cheesman

[11] Patent Number: 5,107,229
[45] Date of Patent: Apr. 21, 1992

[54] SOLID STATE OSCILLATOR FOR GENERATING MICROWAVE SIGNALS

[75] Inventor: Leroy V. Cheesman, Clayton, N.J.

[73] Assignee: Lectronic Research Labs, Camden, N.J.

[21] Appl. No.: 617,825

[22] Filed: Nov. 26, 1990

[51] Int. Cl.[5] .............................................. H03B 7/14
[52] U.S. Cl. ................... 331/185; 331/107 G; 331/173
[58] Field of Search .......... 331/6, 96, 107 R, 107 DP, 331/107 G, 117 D, 185, 173

[56] References Cited

U.S. PATENT DOCUMENTS

| | | | |
|---|---|---|---|
| 2,859,540 | 11/1958 | Himpele | 35/19 |
| 2,878,587 | 3/1959 | Jubenville | 35/19 |
| 3,043,021 | 7/1962 | Thompson | 35/19 |
| 3,261,112 | 7/1966 | Schlag | 35/19 |
| 3,737,802 | 6/1973 | Kawakami | 331/96 |
| 3,946,336 | 3/1976 | Froom et al. | 331/107 R |
| 4,047,126 | 9/1977 | Anderson | 331/185 X |
| 4,213,253 | 7/1980 | Gudelis et al. | 35/19 A |
| 4,449,942 | 5/1984 | Salit | 434/224 |

OTHER PUBLICATIONS

Lectronic Research Labs, Inc., "Microwaves For Everyone" pp. ii-88.

Primary Examiner—David Mis
Attorney, Agent, or Firm—Panitch, Schwarze, Jacobs & Nadel

[57] ABSTRACT

A solid state oscillator which may be used as a microwave electronics teaching aid. The solid state oscillator is powered by a klystron power supply, and is interchangeable with a klystron. The solid state oscillator includes a circuit having inputs, through which a conventional klystron AC filament voltage is inputted. The circuit then rectifies and raises the input voltage to a higher level, and then tunes the higher level DC voltage to a resonant frequency. The raised voltage is powered by a microwave signal by means of a solid state microwave diode mounted in a wave guide.

6 Claims, 1 Drawing Sheet

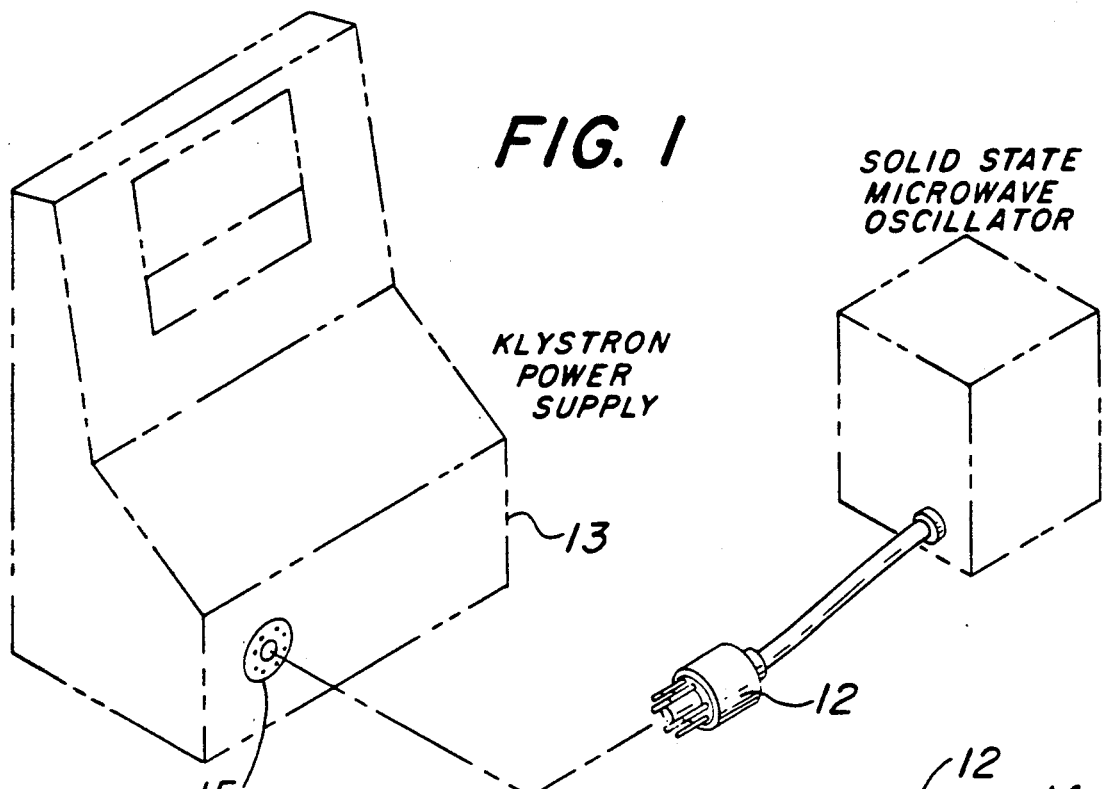
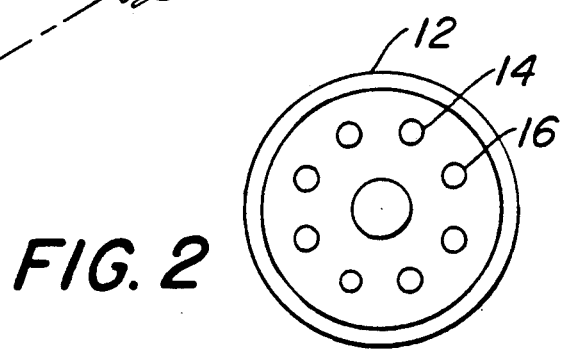
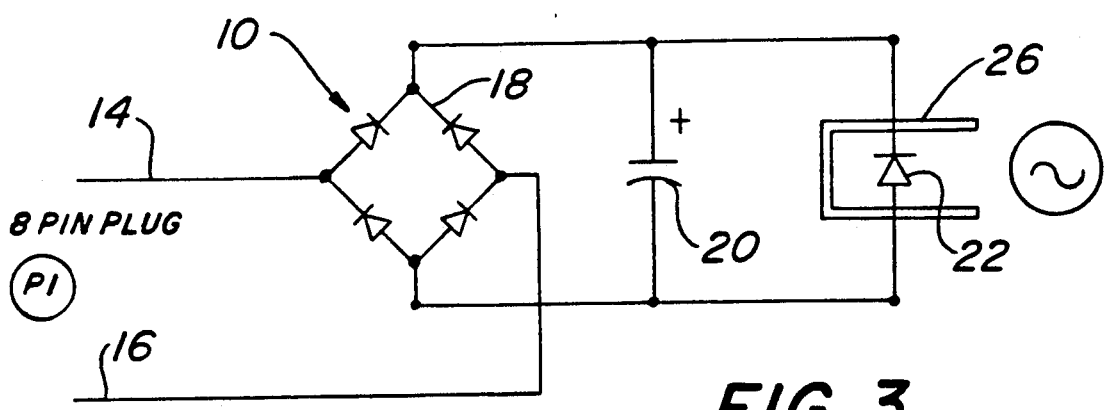

SOLID STATE OSCILLATOR FOR GENERATING MICROWAVE SIGNALS

BACKGROUND OF THE INVENTION

This invention relates generally to a microwave teaching aid in which a solid state microwave oscillator is readily interchangeable with a klystron. In addition, the source of power for the solid state microwave oscillator is the same power supply used by the klystron. The invention also relates to a solid state oscillator which generates a microwave signal.

In the past, klystrons have been the primary device used to generate microwave signals in the teaching of microwave theory. The most common method for teaching microwave theory involves the use of a klystron which is plugged into a klystron mount and then plugged into a power supply. With such existing teaching devices, instructors were able to teach the techniques of using the klystron as part of teaching microwave theory. However, with the advent of solid state microwave devices, it is now desirable for instructors to use solid state devices when teaching microwave theory, as students are expected to be familiar with solid state devices upon their entry into the electronics field.

A need has developed for a solid state device capable of instructing students in the use of solid state microwave devices as part of teaching microwave theory. Such a device is particularly desirable for instructional use, as it is beneficial to students who are novices in electronics to be taught solid state devices for generating microwave energy as well as microwave theory.

It is also beneficial if the solid state device can be used interchangeably with a klystron and its power supply. Since the klystron has been the traditional device used to generate microwave signals when teaching microwave theory, many instructional facilities will already have a klystron and a power supply for it. If a facility already has a klystron and a power supply and wants to teach solid state devices, the facility will only have to acquire the solid state device to accomplish its goal as the pre-existing power supply can be used with the solid state device. Such a solid state device enables the teaching of both klystron and solid state devices as part of the teaching of microwave theory without having to acquire much additional equipment. It is also a benefit if only a single power supply need be acquired and used for instructing both klystron and solid state theory.

Furthermore, in a large instructional environment, the instructor often is not able to individually supervise each student, who may not be aware of or fully cognizant of the safety problems associated with klystrons. Klystrons, when in use, reach high temperatures capable of causing serious injury if they are not handled properly. Additionally, klystron mounts and klystron tube plate caps, when used, have high voltages which can cause shock or death if handled incorrectly. An instructor with many students may not always be able to observe each student handling the potentially dangerous device. Solid state devices are less of a safety problem than a klystron, as solid state devices do not produce nearly as much heat as a klystron because a solid state device does not require heat to emit electrons. Also, for purposes of instruction, solid state devices generally are more efficient under ambient temperature conditions than a klystron because a klystron unlike a solid state device uses a filament and two direct current supplies with high potential, often resulting in leakage of electrons. For the same reason, the signal generated by a solid state microwave device is more stable than that generated by a klystron.

The present invention comprises a solid state teaching oscillator for generating microwave signals which can be used independently or interchangeably with a klystron. The microwave signals are generated by an oscillator comprised of a circuit in which an input voltage is processed by several means within the circuit resulting in the output of a microwave signal.

SUMMARY OF THE INVENTION

Briefly stated, the present invention comprises a solid state teaching oscillator for generating microwave signals which can be used independently or interchangeably with a klystron as both the solid state oscillator and the klystron use the same power source. The solid state oscillator comprises a circuit with an input means for inputting a voltage to the circuit and a stepup means for raising the voltage to a higher level. Once the voltage has been stepped up, it is tuned to a resonant frequency and then emitted with an output means as a microwave signal.

BRIEF DESCRIPTION OF THE DRAWING

The foregoing summary, as well as the following detailed description of a presently preferred embodiment of the invention, will be better understood when read in conjunction with the appended drawing. For the purpose of illustrating the invention, there is shown in the drawing an embodiment which is presently preferred. It should be understood, however, that the present invention is not limited to the particular arrangement and instrumentality shown. In the drawing:

FIG. 1 illustrates the outer geometry and plug of the solid state oscillator being plugged into a pre-existing power supply.

FIG. 2 illustrates the eight-pin plug of the present invention.

FIG. 3 is a schematic illustrating the circuit of the oscillator of the present invention.

DESCRIPTION OF PREFERRED EMBODIMENT

The presently preferred embodiment of the invention described below relates to a solid state oscillator for use as a microwave electronics teaching aid which can be used independently or interchangeably with a klystron as the source of microwave energy. Both the solid state oscillator and the klystron use the same power supply. In general, in the disclosed embodiment, a microwave signal is generated by the solid state oscillator by inputting a voltage to the oscillator circuit. The circuit steps up the voltage inputted to a higher level. Once the voltage is at this higher level, the frequency is tuned to a resonant one. A solid state diode generates a microwave signal.

The solid state oscillator of the preferred embodiment of the present invention employs a circuit with an input means, a step-up means, a tuning means and an output means for emitting a microwave. FIG. 3 is a schematic illustrating the circuit of the solid state oscillator, hereinafter referred to as the oscillator 10. The principal components of the oscillator 10 are: an eight-pin plug 12 shown in FIG. 1 and 2 with two pins 14 and 16, connected to a full wave bridge rectifier 18 wired in parallel to a capacitor 20 which in turn is connected in parallel to a microwave generating Gunn diode 22 mounted on waveguide 26.

The components of the present invention are all available from commercial manufacturers. The plug 12 with clamp and the attached cord are obtainable from Amphenol and Beldon with part numbers 86-3-24 and 1247. The bridge rectifier 18 is available from RCA and has part number 8334. The diode 22 is from Alpha with part number G052573, and the capacitor has a capacitance of 470 microfareds at 50 volts DC. It is understood that the components are not limited to the particular components disclosed, as the invention may be embodied in other specific forms.

In the preferred embodiment of the invention, the inputs 14 and 16 on the eight-pin plug 12 are AC inputs with an AC voltage of 6.3 V at 60 Hz. The other six pins on the plug 12 are blank as only two pins are required to power the solid state microwave oscillator. Once the plug 12 is plugged into a power supply 13 with an eight-pin receptacle 15, as shown in FIG. 1, the AC input is applied by the power supply to the circuit, and the bridge rectifier 18 steps up the voltage to a direct current level 1.4 times that of the input voltage, i.e., 8.82 volts DC. The voltage comes out of the bridge rectifier 18 at opposite ends with positive polarity. The capacitor 20, acting not as a filter, but instead as a tuner, tunes the circuit to a resonant frequency of 120 Hz. The signal coming out of the resonant circuit allows the power to go up and down at the rate of 120 pulses a second. The waveguide 26 provides for transmission of the high frequency electromagnetic wave without a loss in power. The diode 22 then emits an RF carrier signal produced as and x-band microwave signal with a frequency of 10.25 GHz at 10 mW of power.

The oscillator 10 uses only a filtered AC input, whereas a klystron requires a filament AC voltage of 6.3 V at 60 Hz as an input. It should also be noted that the oscillator 10 can be interchanged with a klystron without any type of modification because the oscillator 10 utilizes the filament voltage through the use of the two inputs 14 and 16.

It should also be appreciated by those skilled in the art that although an eight-pin plug 12 is preferred in the present embodiment, other types of connectors could be used instead of the plug 12. For example, direct wire connection, with two AC inputs could be used. The eight-pin plug 12 with six blank pins is the presently preferred embodiment of the invention as the power supplies commonly used for powering klystrons have eight-pin plug receptacles.

Additionally, even though a Gunn diode is used as the preferred diode in the construction of the preceding embodiment of the invention in so much as the Gunn diode is one member of the class of diodes which are capable of emitting microwave signals, it is apparent other types of diodes, providing higher frequencies can be substituted for the Gunn diode as an obvious modification of the preferred embodiment. Although the present embodiment of the invention is described generating an X-band RF carrier signal, it is apparent that other types of microwave signals can be generated by the present invention with modifications.

From the foregoing description, it can be seen the present invention comprises a solid state oscillator for use as a microwave electronics teaching aid which is powered by a klystron power supply and is interchangeable with a klystron for generating microwave signals. It will be appreciated by those skilled in the art that changes and modifications may be made to the above-described embodiment without departing from the invention and concepts thereof. It is understood, therefore, that the present invention is not limited to the particular embodiment disclosed, but is intended to include all modifications and changes within the scope and spirit of the invention, as defined by the appended claims.

I claim:

1. A solid state microwave oscillator interchangeably connectable to the electric power supply for a klystron, comprising:
   a full wave rectifier circuit;
   circuit means for connecting the AC voltage normally provided by the power supply to the input of the rectifier circuit;
   capacitive means connected across the DC output terminals of said rectifier circuit, the value of said capacitor means enabling resonance with the ripple frequency of the DC output of said rectifier;
   the DC filtered output of said rectifier circuit being connected directly to the solid state microwave oscillator.

2. The solid state microwave oscillator of claim 1 wherein the output voltage of said power supply is normally the filament voltage for a klystron, and the rectifier increases the voltage sufficiently to pulse the diode within the solid state oscillator on and off.

3. The solid state microwave oscillator of claim 2 wherein the AC input voltage to the rectifier circuit is a filament voltage of 6.3 volts Ac and the peak output voltage of said rectifier is 1.4 times the input value.

4. The solid state microwave oscillator of claim 2, wherein the full wave rectifier is a bridge rectifier.

5. The solid state microwave oscillator of claim 1 wherein the input voltage is at 60 Hz and the ripple frequency is at 120 Hz.

6. The solid state microwave oscillator of claim 1 wherein the microwave oscillator is a Gunn diode which emits an X band RF carrier signal at a frequency of 10.25 GHz.

* * * * *